United States Patent [19]

Meeker et al.

[11] 4,138,692
[45] Feb. 6, 1979

[54] GAS ENCAPSULATED COOLING MODULE

[75] Inventors: Robert G. Meeker, La Grangeville; William J. Scanlon, Hopewell Junction; Zvi Segal, Wappingers Falls, all of N.Y.

[73] Assignee: International Business Machines Corporation, Armonk, N.Y.

[21] Appl. No.: 832,716

[22] Filed: Sep. 12, 1977

[51] Int. Cl.$^2$ ............... H01L 25/04; H01L 23/42; H01L 23/44
[52] U.S. Cl. ........................... 357/82; 357/75; 357/76; 357/79; 165/80
[58] Field of Search ............. 357/82, 81, 76, 79; 174/15; 165/80, 105

[56] References Cited

U.S. PATENT DOCUMENTS

| | | | |
|---|---|---|---|
| 2,780,757 | 2/1957 | Thornhill et al. | 357/82 |
| 3,307,087 | 2/1967 | Rogers et al. | 357/82 |
| 3,649,738 | 3/1972 | Andersson et al. | 357/82 |
| 3,703,668 | 11/1972 | Bylund et al. | 357/82 |
| 3,826,957 | 7/1974 | McLaughlin | 357/82 |
| 3,991,396 | 11/1976 | Barkan | 357/82 |
| 3,993,123 | 11/1976 | Chu et al. | 357/82 |
| 4,067,042 | 1/1978 | Novak et al. | 357/82 |

*Primary Examiner*—Andrew J. James
*Attorney, Agent, or Firm*—Wesley DeBruin

[57] ABSTRACT

A gas encapsulated cooling module wherein at least one semiconductor chip to be cooled is supported on a substrate portion of the module the provision of a heat sink stud having a planar surface in thermal contact with a planar surface of the chip to be cooled, said stud being supported by a resilient thermally conductive bellow-like structure, whereby the planar surface of the stud is maintained in intimate thermal contact with the planar surface of the chip.

15 Claims, 6 Drawing Figures

GAS ENCAPSULATED COOLING MODULE

BACKGROUND OF THE INVENTION AND PRIOR ART

With the advance of solid state electronics, various improved means of dissipating the heat generated by solid state components have been investigated. The standard forced air convection means appears to have reached its limit of practicality in that the amount of air that is required to provide sufficient cooling for the limited heat dissipating surfaces introduces a noise problem, and without some auxiliary techniques cannot maintain each of a large number of components, such as integrated circuit semiconductor chips, within their proper operating temperature range. Accordingly, especially in connection with high speed data processing systems and the like, combinations of air-liquid cooling systems have been devised. One such system is an immersion cooling system, wherein the array of components to be cooled is immersed in a tank of cooling liquid. The liquids frequently employed are the fluorocarbon liquids which have a low-boiling point. These liquids are dielectric and give rise to various types of boiling at relatively low temperatures. In view of the problems encountered in servicing and packaging components which are cooled using this immersion technique, an encapsulated cooling technique was provided which includes the same dielectric material encapsulated separately for each module. U.S. Pat. No. 3,741,292, issued June 26, 1973 shows an example of a module having the heat generating components located thereon surrounded by a low boiling point dielectric liquid which is encapsulated thereto. A vapor space is located above the liquid level, which is filled with internal fins extending into the container serving as a condenser for the dielectric liquid vapors. External fins extend outward from the container and serve as an air cooled sink for the internal fins condenser. However, this type of a modular liquid encapsulated cooling device must meet certain inflexible requirements. For instance, it requires coolant of extremely high purity and free of any contaminants. It's operation is sensitive to all the variables which govern the basic process of nucleate boiling and vapor condensation. Furthermore, the concept is not readily adaptable to small scale applications such as a single heat generating component or semiconductor chip.

Reference is made to U.S. Pat. No. 3,993,123 entitled "Gas Encapsulated Cooling Module" granted Nov. 23, 1976 to Richard C. Chu et al. In the Chu et al. Patent a gas encapsulated cooling unit is provided for one or more heat generating devices (such as semiconductor chips) to be cooled. The components are mounted on a substrate. A cap is sealed to the substrate enclosing the heat generating devices to be cooled. An inert gas and good thermal conductive elements are contained within the sealed volume between the cap and the substrate. Each of the heat conductive elements are urged against respective ones of the heat generating devices forming a small gas gap (interface) to provide low thermal resistance. A heat sink associated with the cap receives the heat from the heat conductive elements through an annular gap which likewise contains inert gas.

Reference is made to U.S. Pat. No. 3,512,582 entitled "Immersion Cooling System for Modularly Packaged Components" granted May 19, 1970 to Richard C. Chu et al. In the Chu et al patent an immersion cooling system for modularly packaged components (such as semiconductor chips) is provided comprising a common vessel containing a low-boiling-point liquid. A plurality of modular units, each containing an individual cooling chamber, are connected to the common vessel by respective input and output conduit means. The individual cooling chambers and the input conduit means are arranged with respect to the common vessel such that the liquid will flow from the vessel through the input conduit into the individual cooling chambers by gravitational force. The output conduit means provides the vent path and liquid expansion path for the respective cooling chambers. Heat generating components are located in each of the cooling chambers in heat exchange contact with the low boiling-point liquid so as to provide cooling. A heat exchanger is provided associated with each of the individual cooling chambers for removing heat from the low-boiling point liquid so as to provide sufficient cooling to maintain said electronic components substantially at a predetermined temperature.

Reference is made to U.S. Pat. No. 3,524,497 entitled "Heat Transfer In A Liquid Cooling System" granted Aug. 18, 1970 to Richard C. Chu et al. In the Chu et al patent electronic components, such as semiconductor chips, or the like, are mounted on one end of heat conducting cooling studs. The semiconductor carrying ends of the cooling studs are connected to one side of a circuit board. The circuit board forms one wall of a narrow channel through which liquid is forced to flow. The studs extend from the wall into the channel in spaced relationship with respect to one another. Further studs, connected to the opposite wall, extend into the channel, parallel to the cooling studs and in spaced, staggered relation thereto. The further studs cause an increase in the turbulence of the flowing liquid around the heat conducting studs and direct the flow of cooling liquid over a greater area of the cooling studs, thus increasing the heat transfer therefrom.

Reference is made to U.S. Pat. No. 3,586,101, entitled "Cooling System for Data Processing Equipment" granted June 22, 1971 to Richard C. Chu et al. The Chu et al patent discloses a liquid cooling system for data processing equipment in which a plurality of electronic component modules to be cooled are located in chambers which have a cooling liquid circulating therethrough by gravity feed from a buffer storage reservoir located at the top of the cooling system. A phase-separation column is provided which is connected to the output of each of the module chambers by equal length conduits. The components within the modules give rise to nucleate boiling within the cooling liquid. The vapor bubbles and the cooling liquid passes through the conduit and enter the phase-separation column where the vapor bubbles rise and the liquid drops. A condenser is located above the phase-separation column for condensing the vapor bubbles. The condensate and the liquid in the phase-separation column are returned to the circulation system. A cooling means is located in the circulation system for returning the cooling fluid to a temperature below the boiling point.

Reference is made to U.S. Pat. No. 3,673,306 entitled "Fluid Heat Transfer Method and Apparatus for Semi-Conducting Devices" granted June 27, 1972 to Milton E. Kirkpatrick. The Kirkpatrick patent discloses the use of a heat pipe type thermal conductive path within a metallic housing such as a transistor can for cooling of high power semiconductor devices which normally require large heat dissipation. An electrically non-conductive wick structure is provided which is formed, for example, from high purity silica glass cloth in a shape resembling a hollow "marshmallow" and which forms a liner for the entire transistor can. The wick contacts both the active surface of the semiconductor device in the bottom of the can and the upper walls of the can. Prior to placing the can upon its mounting base, an appropriate amount of electrically non-conductive, non-polar working fluid such as high purity organic liquid is loaded so that it entirely fills or saturates only the wick like structure. The working fluid held within the wick is thus in immediate contact with the active surface of the semiconducting device. In operation, the surface of the semiconductor device serves as the evaporator section of the closed loop heat pipe. As fluid is caused to evaporate from this region, heat transfer and thus cooling of the device is effected. The vapor thus produced is recondensed over regions of the can which are at slightly cooler temperatures than the semiconductor device. The working fluid vapor thus provides an efficient heat transfer path to the entire radiating surface of the can in order to dissipate the thermal energy of concern.

Reference is made to U.S. Pat. No. 3,957,107 entitled "Thermal Switch" granted May 18, 1976 to Frank E. Altoz. The Altoz Patent discloses a sealed extensible bellows containing freon and a flexible wick providing a heat pipe. The fixed end of the bellows is attached to a heat sink (a cold body). The other movable end of the bellows carries a thermally conductive plate that moves from a non-engaging relationship to an engaging relationship with a temperature regulated surface (for example an oscillator circuit) at a predetermined temperature of the cold body.

Reference is made to the IBM Technical Disclosure Bulletin Publication entitled "Modular Heat Sink" by H. Parsapour, Vol. 17, No. 11, April 1975, page 3313. In the Parsapour publication heat conductivity and thermal contact between a heat sink and a semiconductor module is obtained by using a heat pipe in the form of a longitudinally flexible bellows tube.

Reference is made to the IBM Technical Disclosure Bulleting Publication entitled "Controlling Pressure Changes in a Liquid Encapsulated Module" by N. G. Aakalu et al, Vol. 14, No. 8, January 1972, page 2533. In the Aakalu et al publication the pressure change is compensated for by a bellows which is completely immersed within the liquid. The bellows has an opening to the ambient air for operation.

SUMMARY OF THE INVENTION

An encapsulated cooling unit is provided for one or more heat generating devices (such as semiconductor chips) to be cooled which are mounted on a substrate. A cap is sealed to the substrate enclosing the heat generating devices to be cooled. An inert gas and good thermal conductive elements are contained within the sealed volume between the cap and the substrate. Each of the heat conductive elements are urged against respective ones of the heat generating devices by a resilient thermally conductive bellows like structure, to form a minimal width gas gap to provide a low thermal resistance. A heat sink associated with the cap receives the heat from the heat conductive elements.

The foregoing and other objects, features and advantages of the invention will be apparent from the following more particular description of a preferred embodiment of the invention, as illustrated in the accompanying drawings.

It is an object of the invention to provide an improved gas encapsulated semiconductor device cooling structure.

It is an object of the invention to provide an improved gas encapsulated cooling unit which utilizes inert gas having good thermal conductivity as the encapsulated medium in combination with a heat conductive bellows like structure.

It is a further object of the invention to provide an improved gas encapsulated cooling module structure wherein at least one semiconductor chip to be cooled is supported on a substrate portion of the module including the provision of a heat sink stud having a planar surface in thermal contact with a planar surface of the chip to be cooled, said stud being supported by a resilient thermally conductive bellows like structure, whereby the planar surface of the stud is maintained in intimate thermal contact with the planar surface of the chip.

DESCRIPTION OF THE PREFERRED EMBODIMENTS

Figure 1:
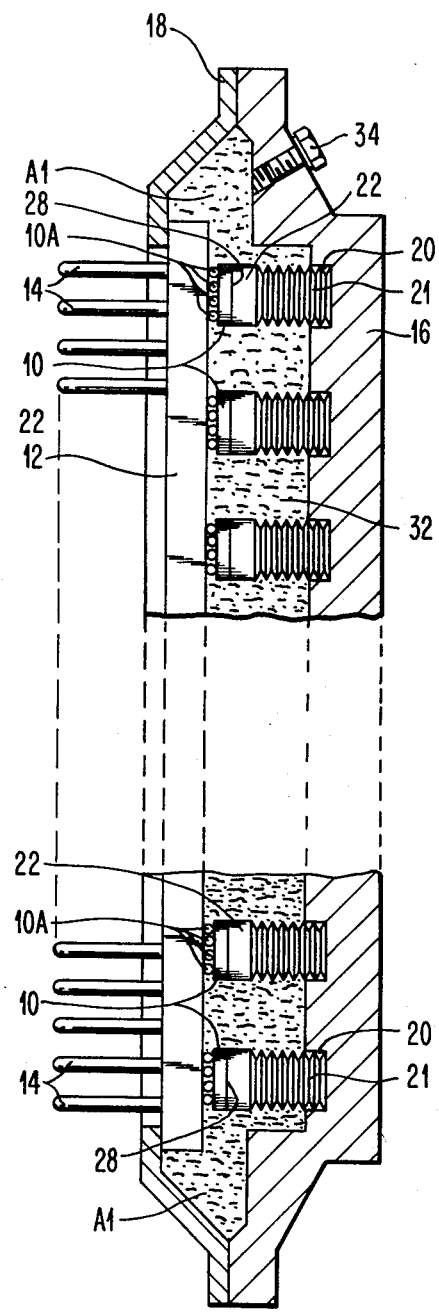
FIG. 1 discloses a cross-sectional view of an embodiment of the improved gas encapsulated module in accordance with the invention.

Referring to FIG. 1 there is shown a cross-sectional view of a gas encapsulated module, in accordance with the invention, for providing cooling of the solid state electronic chips 10. As is well known, the chip consists of solid state circuits and devices which are densely packed on each chip. The power consumed in the circuits within the chip generate heat which must be removed from the chip. Since the various circuits have different power requirements, and since the integrated components thereon must be maintained within certain temperature ranges for reliable operation, the cooling must be of such character as to maintain the chip temperature within the required operation range.

The chips 10 are mounted on one side of a substrate 12, generally made of ceramic, which has pins 14 extending from the other side thereof. For purposes of this description it is sufficient to merely appreciate that the integrated circuits on the chips are connected by known techniques via "solder balls" 10A to conductors (not shown) in the substrate 12. These conductors are in turn selectively connected to pins 14. These connecting pins 14 provide for the plugging of the module into a board (not shown) which may carry auxilliary circuits, etc. A container or cap 16 is attached to the substrate 12 by means of a flange 18 which extends from the periphery of the substrate 12 to the cap 16. The cap 16 is made of a good heat conductive material such as copper or aluminum. The cap 16 contains a number of recesses, or blind openings, 20. The recesses in cap 16 are arranged in a pattern corresponding to the chip positions on substrate 12. Each recess in cap 16 is disposed opposite to and in alignment with a chip 10. The recesses 20 within the cap member 16 are accurately sized to receive a resilient thermally conductive bellows like structure, or bellows 21. Each bellows 21, as viewed in FIG. 1 is in thermal communication with a thermally conductive element or stud 22. Each stud 22 has a planar surface forming an interface with the opposing disposed planar surface of its associated chip. Each bellows 21 is sufficiently resilient so that the planar surface of its associated stud can attain relatively flat surface engagement with the planar surface of the oppositely disposed chip. It will also be appreciated that the studs 22 respectively adapt to chips 10 of various heights because of the resiliency of bellows 21. Thus, the thermal resistance of the stud/chip interface 28 is reduced due to the improved degree of intimate physical contact between the oppositely disposed planar surface of the stud and chip. A thermally conductive fluid 32, preferably helium, is introduced into the open space between the substrate and cap through the fluid fill opening 34. Helium gas is utilized for several reasons. The gas has a low molecular weight and thus readily permeates and fills the voids in the stud/chip interfaces 28. Also, with reference to the structure of FIG. 1 the helium gas 32 fills the volume of each of the bellows structures 21. Each bellows 21 preferably contains suitably disposed perforations to facilitate a uniform distribution of helium gas and pressure thereof in all physically unoccupied space contained within the volume generally defined by the substrate 12 and cap 16. This volume is depicted in FIG. 1 by reference character A1.

A physical characteristic of helium gas is that it is a good thermal conductor and therefore forms an interface (stud/chip) having high heat conductivity. That is the interfaces formed using helium gas have relatively low thermal resistance. Another physical characteristic of helium gas which is very important is that it is an inert gas. By inert is meant that the gas is electrically non-conductive, non-poisonous, non-corrosive, non-flammable, non-explosive and non-toxic. The gas also has a high adhesion quality that essentially wets the surface which it is in contact with. Other low-molecular weight gases such as hydrogen or carbon dioxide could be used. However, these gases appear to have undesired properties such as the explosive nature of hydrogen.

Figure 2:
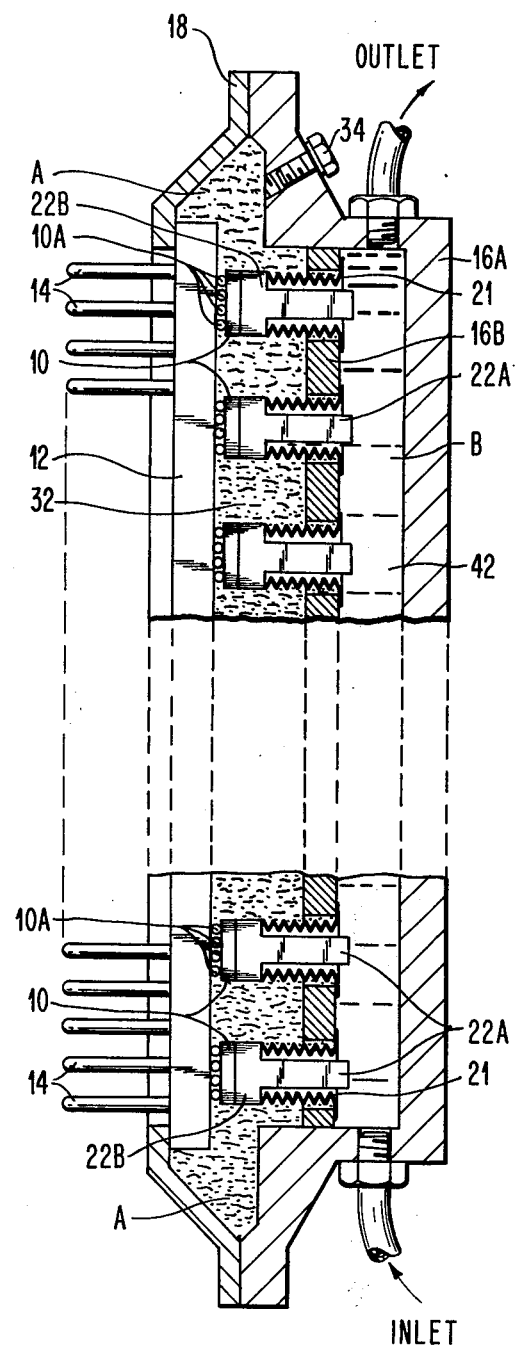
FIG. 2 discloses a cross-sectional view of a further embodiment of an improved gas encapsulated module in accordance with the invention.
Figure 1A:
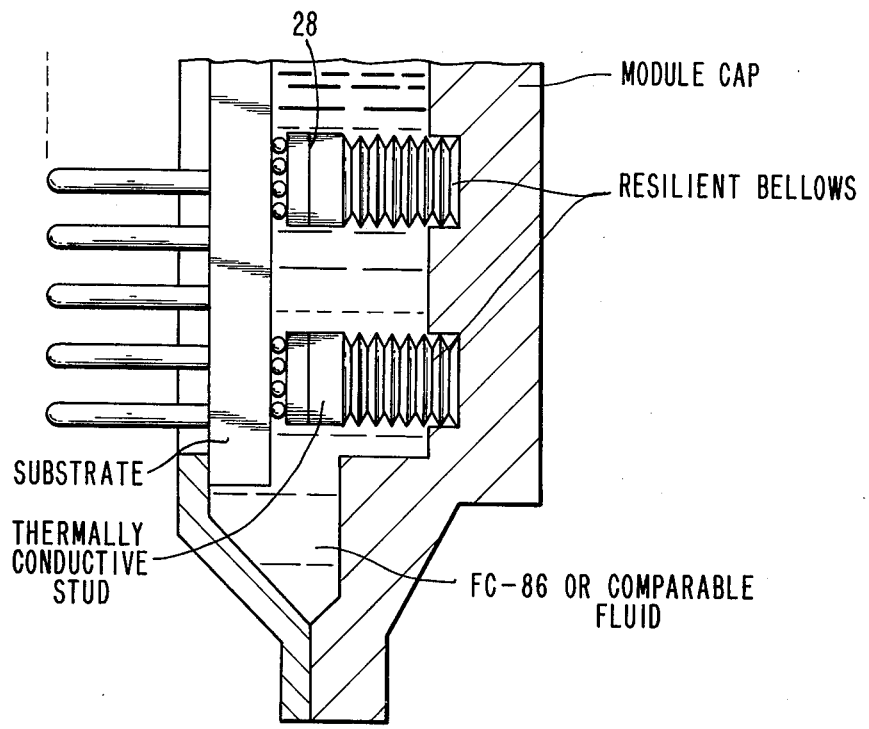
FIG. 1A discloses an enlarged view of a portion of the structure depicted in FIG. 1.
Figure 2A:
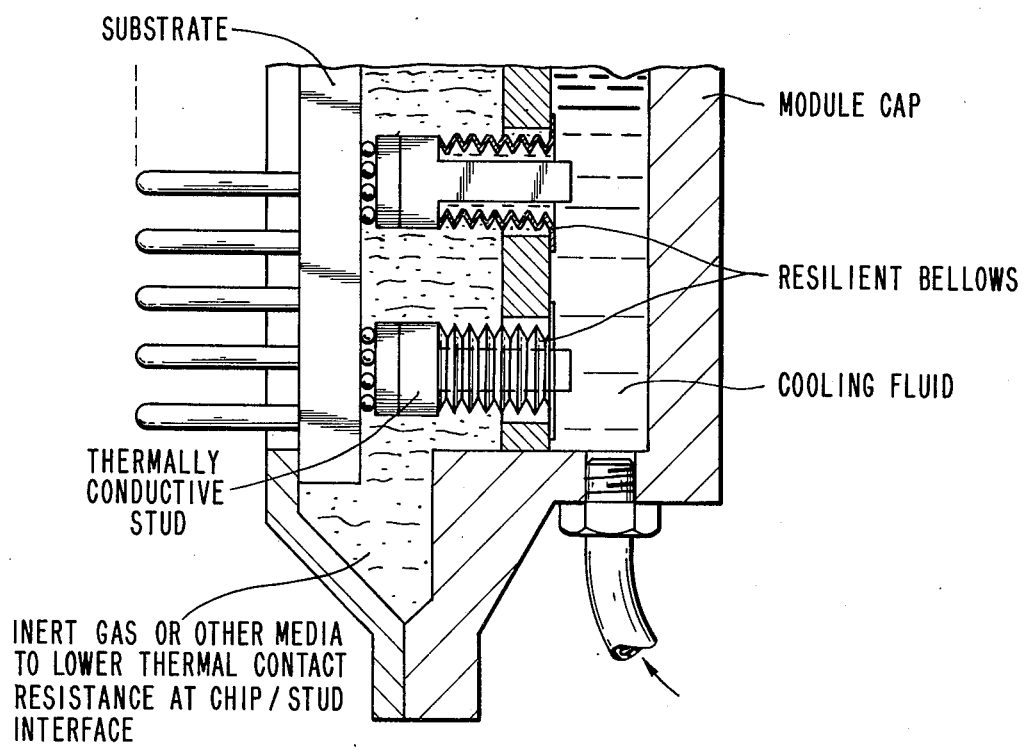
FIG. 2A discloses an enlarged view of a portion of the structure depicted in FIG. 2.

The module structure in accordance with the invention may employ a cold plate structure (cooling jacket) wherein a portion of each thermal conductive element, or stud, projects into the cooling jacket. Referring to FIGS. 1 and 2, like reference characters refer to like structure.

In FIG. 2 the planar alignment of the cooling stud 22A, 22B with the chip planar surface is, as in the embodiment of FIG. 1, enhanced by the action of resilient bellows 21. In FIG. 2, each bellows like structure 21, studs 22A/22B and plate 16B forms a hermetic seal between chambers A and B. More particularly each bellows is hermetically sealed to, or within an aperture in plate 16B and its associated heat stud 22A/22B. Each aperature in plate 16B is aligned with a chip position on substrate 12. Each stud 22A/22B has a first portion 22B which has a planar surface forming an interface with the opposingly disposed essentially planar surface of its associated chip. Still referring to FIG. 2, each bellows like structure 21, carrying stud 22A/22B, is sufficiently resilient so that the planar surface of portion 22B attains intimate physical surface engagement with the planar surface of the oppositely disposed chip. As in the embodiment of FIG. 1 it will be appreciated that through the resilient nature of the bellows the studs 22A/22B adapt to chips 10 varying in height displacement from the surface of substrate 12. Thus in the embodiment of FIG. 2, as in the embodiment of FIG. 1, the thermal resistance of the stud/chip interface is reduced due to the improved degree of intimate physical contact between the opposing planar surfaces of the stud and chip. In FIG. 2 a thermally conductive fluid 32, preferably helium, is introduced into the open space between the substrate 12 and the opposing hermetically sealed structure comprised of plate 16A, bellows 21 and studs 22A/22B, through the fluid fill opening 34. This space, or volume, which includes the interfaces between studs and chips is the hermetically sealed volume depicted by reference character A in FIG. 2. It is to be noted that the volume A1 of FIG. 1 includes the space within each bellows like structures whereas the volume A in FIG. 2 does not include the space within the bellows like structures. Still referring to FIG. 2 the space, or volume, between plate 16A and the hermetically sealed structure formed by plate 16B, bellows like structures 21 and studs 22A/22B is a chamber designated by reference character B. As depicted in FIG. 2, chamber b, has an inlet and an outlet through which a suitable cooling liquid such as water, is caused to flow. It will be noted that the upper portion 22A of each of the studs 22A/22B projects into chamber B. Thus each stud 22A/22B projects into the cooling fluid.

Figure 3:
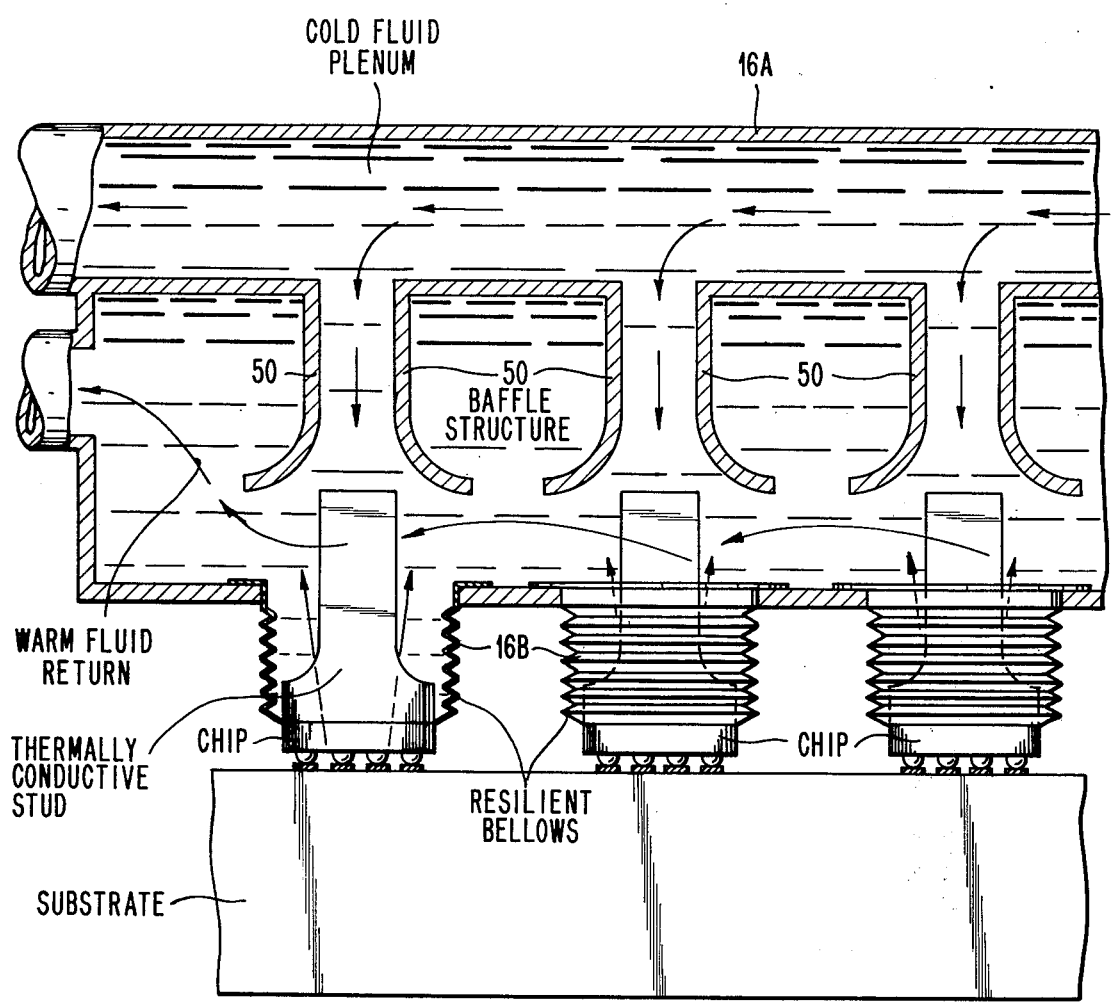
FIG. 3 discloses a cross-sectional view of another embodiment of an improved gas encapsulated module in accordance with the invention.
Figure 4:
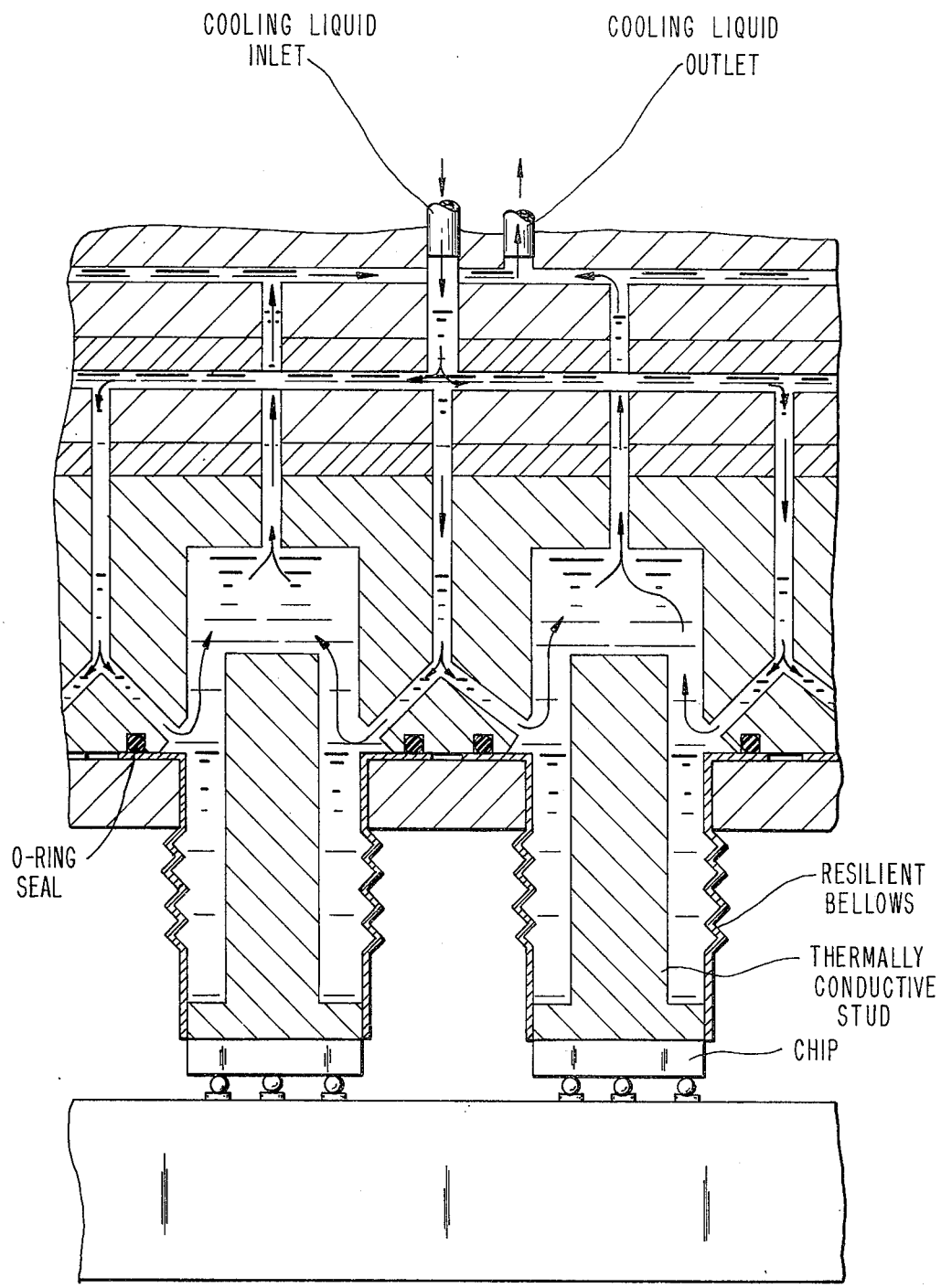
FIG. 4 discloses a cross-sectional view of yet another embodiment of an improved gas encapsulated module in accordance with the invention.

FIGS. 3 and 4 respectively disclose further embodiments of the invention. These embodiments with the exception of the structure described hereinafter are respectively similar to the embodiment of FIG. 2. In FIG. 3 a baffle structure 50 is provided in chamber B (FIG. 2) to direct coolant from a cold liquid plenum directly to each bellows/studs structure. Thus the temperature of the coolant liquid to each chip location is more uniform than in a structure such as FIG. 2 where the coolant flows serially from chip location to location. In FIG. 4, the cooling liquid is directed from a source of cooling liquid (not shown) via individual ducts to each cooling stud. The cooling liquid from each stud position in the embodiment of FIG. 4 is returned through individual ducts to the source of cooling liquid.

The combination of the high heat conductivity of helium and the ability of helium to fill gaps, together with the improved physical contact at the stud/chip interface provided by the bellows like structure, has been utilized in each embodiment of the invention to provide a further improved thermal junction of the chip stud interface and an improved cooling module.

As will be apparent to persons skilled in the art from the preceding detailed description of the preferred embodiment of the invention, numerous changes and modifications may be made without departing from the spirit and scope thereof. Merely, by way of example, although as recited herein the bellows like structure is preferably metal, it will be apparent that the invention encompasses structures wherein the bellows like structure is fabricated from material other than metal, such as plastic, etc.

While the invention has been particularly shown and described with reference to a preferred embodiment thereof, it will be understood by those skilled in the art that the foregoing and other changes in form and detail may be made therein without departing from the spirit and scope of the invention.

What is claimed is:

1. A cooling module for integrated circuit chips, said cooling module comprising:
   a multilayer ceramic substrate having a first essentially planar surface and a second essentially planar surface, said multilayer ceramic substrate including an electrical circuit pattern contained therein and on at least one of said planar surface;
   a plurality of integrated circuit chips supported on said first planar surface of said substrate and electrically connected to said electrical circuit pattern of said multilayer ceramic substrate, each of said semiconductor chips having an essentially exposed planar surface;
   a plurality of electrically conductive connector pins extending from said second planar surface of said substrate, said plurality of electrically conductive pins being electrically connected to said electrical circuit pattern of said substrate;
   module cap means hermetically sealed to said substrate to provide a volume encompassing said plurality of chips;
   a plurality of bellows like structures, each of said bellows like structures extending from the exposed planar surface of a discrete one of said chips to said module cap means; and
   a cooling medium contained within said hermetically sealed volume formed by said substrate and said module cap means.

2. A cooling module for integrated circuit chips as recited in claim 1, wherein each of said bellows like structures includes a thermally conductive element having a planar surface, and said planar surface of each said thermally conductive element is positioned in at least close physical proximity to the exposed planar surface of a discrete one of said integrated circuit chips.

3. A cooling module for integrated circuit chips as recited in claim 1, wherein said module cap means has an essentially planar internal surface, said internal planar surface of said module cap means being essentially co-extensive with and extending parallel to said planar surfaces of said substrate;
   a plurality of recesses in said internal planar surface of said module cap means;
   each of said recesses being in alignment with the exposed planar surface of a discrete one of said integrated circuit chips and partially encompassing a portion of a corresponding one of said bellows like structures.

4. A cooling module for integrated circuit chips as recited in claim 1, wherein the hermetically sealed volume containing said cooling medium includes the volume within each of said bellows like structures.

5. A cooling module for integrated circuit chips as recited in claim 1, wherein the cooling medium is a fluid, such as a flourocarbon or water.

6. A cooling module for integrated circuit chips as recited in claim 1, wherein the cooling medium is an inert gas, such as helium.

7. A cooling module for integrated circuit chips as recited in claim 1 wherein each said bellows like structure is an elongated structure having a first enclosed end adjacent a chip exposed planar surface and a second open end in communication with a further cooling medium wholly contained within said module cap means.

8. An electronic packaging structure for semiconductor integrated circuit chips, said structure having enhanced heat dissipating capability; said packaging structure comprising:
   a planar structure having first and second surfaces, said planar structure having contacts on said first and second surfaces, said planar structure including electrical conductors electrically interconnecting said contacts in a predetermined manner;
   a plurality of semiconductor integrated circuit chips disposed on said first surface of said planar structure;
   connection means electrically connecting each of said chips to selected contacts on said first surface of said planar structure;
   a plurality of thermally conductive bellows like structures, each of said bellows like structures forming a thermal interface with a discrete one of said plurality of chips, whereby a plurality of paths each having low thermal resistance are provided, each said low resistance path including, in the order recited, a semiconductor chip, a chip/bellows like structure interface and a bellows like structure; and
   a single heat sink structure thermally coupled to each of said paths having low thermal resistance.

9. An electronic packaging structure for semiconductor integrated circuit chips as recited in claim 8, wherein said single heat sink includes a cooling jacket containing a cooling liquid.

10. An electronic packaging structure for semiconductor integrated circuit chips as recited in claim 9, wherein each of said bellows like structures has a first portion and a second portion integral with said first portion, where said first portion of each bellows like structure forms said thermal interface with a discrete of one of said chips and said second portion of each said bellows like structure is exposed to the cooling liquid in said cooling jacket.

11. An electronic packaging structure for semiconductor integrated circuit chips as recited in claim 10, wherein said cooling jacket contains a baffle structure for directing the circulation of said cooling liquid to said second portions of said bellows like structures.

12. An electronic packaging structure for semiconductor integrated circuit chips as recited in claim 10, wherein said cooling jacket includes means for directing cooling liquid directly to and from each of said second portions of said bellows like structures.

13. An electronic packaging structure for semiconductor integrated circuit chips as recited in claim 10, wherein said single heat sink structure is a portion of a package cover hermetically sealed to said planar structure, said cover providing a first volume utilized as said cooling jacket and a second volume hermetically sealed from said first volume;
   said second volume having exposed therein at least a portion of each of said chips and at least a portion of each of said first portions of said bellows like structures, said second volume containing under pressure an inert thermally conductive fluid.

14. An electronic packaging structure for integrated circuit chips as recited in claim 13, wherein said inert thermally conductive fluid is helium.

15. An electronic packaging structure for integrated circuit chips as recited in claim 13 wherein said inert thermally conductive fluid is a fluorocarbon.

* * * * *